(12) United States Patent
Verschuuren et al.

(10) Patent No.: US 8,318,253 B2
(45) Date of Patent: Nov. 27, 2012

(54) IMPRINT LITHOGRAPHY

(75) Inventors: Marcus Antonius Verschuuren, Oisterwijk (NL); Sander Frederik Wuister, Eindhoven (NL)

(73) Assignees: ASML Netherlands B.V., Veldhoven (NL); Koninklijke Philips Electronics N.V., Eindhoven (NL)

( * ) Notice: Subject to any disclaimer, the term of this patent is extended or adjusted under 35 U.S.C. 154(b) by 1812 days.

(21) Appl. No.: 11/478,305

(22) Filed: Jun. 30, 2006

(65) Prior Publication Data
US 2008/0011934 A1    Jan. 17, 2008

(51) Int. Cl.
*B05D 5/00* (2006.01)
(52) U.S. Cl. ......... 427/256; 427/261; 264/320; 264/496
(58) Field of Classification Search ................ 427/256, 427/261; 264/320, 496
See application file for complete search history.

(56) References Cited

U.S. PATENT DOCUMENTS

| | | | |
|---|---|---|---|
| 4,731,155 A | 3/1988 | Napoli et al. | |
| 5,512,131 A | 4/1996 | Kumar et al. | 156/655.1 |
| 5,772,905 A | 6/1998 | Chou | |
| 6,165,911 A | 12/2000 | Calveley | 438/754 |
| 6,309,580 B1 | 10/2001 | Chou | 264/338 |
| 6,334,960 B1 | 1/2002 | Willson et al. | |
| 6,365,059 B1 | 4/2002 | Pechenik | 216/52 |
| 6,375,870 B1 | 4/2002 | Visovsky et al. | 264/1.31 |
| 6,482,742 B1 | 11/2002 | Chou | 438/690 |
| 6,518,189 B1 | 2/2003 | Chou | |
| 6,656,341 B2 | 12/2003 | Petersson et al. | 205/667 |
| 6,696,220 B2 | 2/2004 | Bailey et al. | 430/272.1 |
| 6,719,915 B2 | 4/2004 | Willson et al. | 216/44 |
| 6,921,615 B2 | 7/2005 | Sreenivasan et al. | 430/22 |
| 7,431,858 B2 | 10/2008 | Spiess et al. | |
| 2002/0093122 A1 | 7/2002 | Choi et al. | 264/401 |
| 2002/0094496 A1 | 7/2002 | Choi et al. | 430/322 |
| 2002/0132482 A1 | 9/2002 | Chou | 438/692 |
| 2002/0167117 A1 | 11/2002 | Chou | 264/338 |
| 2002/0177319 A1 | 11/2002 | Chou | 438/690 |

(Continued)

FOREIGN PATENT DOCUMENTS

JP      2004-25656 A      1/2004

(Continued)

OTHER PUBLICATIONS

Stephen Y. Chou, et al., "Nanoimprint Lithography", J. Vac. Sci. Technol. B 14(6), Nov./Dec. 1996, pp. 4129-4133.

(Continued)

*Primary Examiner* — Michael Cleveland
*Assistant Examiner* — Xiao Zhao
(74) *Attorney, Agent, or Firm* — Pillsbury Winthrop Shaw Pittman LLP

(57) ABSTRACT

A method of making an imprint lithography template includes applying a curable material to a patterned surface of a master imprint template, allowing the curable material to cure and thereby forming a second imprint template having a patterned surface which is the inverse of the patterned surface of the master imprint template; removing the second imprint template from the master imprint template; applying inorganic sol-gel to a substrate; imprinting the inorganic sol-gel with the second imprint template; allowing the inorganic sol-gel to cure; and removing the second imprint template from the cured inorganic sol-gel, such that the inorganic sol-gel forms a third imprint template having a patterned surface which corresponds with the patterned surface of the master imprint template.

19 Claims, 6 Drawing Sheets

U.S. PATENT DOCUMENTS

| | | | |
|---|---|---|---|
| 2003/0034329 A1 | 2/2003 | Chou | 216/44 |
| 2003/0080471 A1 | 5/2003 | Chou | 264/338 |
| 2003/0080472 A1 | 5/2003 | Chou | 264/338 |
| 2003/0081193 A1 | 5/2003 | White et al. | 355/72 |
| 2003/0127580 A1 | 7/2003 | Ling et al. | 249/115 |
| 2003/0139042 A1 | 7/2003 | Heidari | 438/689 |
| 2003/0141291 A1 | 7/2003 | Heidari et al. | 219/460.1 |
| 2003/0159608 A1 | 8/2003 | Heidari | 101/494 |
| 2003/0170053 A1 | 9/2003 | Montelius et al. | 399/318 |
| 2003/0189273 A1 | 10/2003 | Olsson | 264/293 |
| 2004/0005444 A1 | 1/2004 | Heidari | 428/212 |
| 2004/0009673 A1 | 1/2004 | Sreenivasan et al. | 438/694 |
| 2004/0021866 A1 | 2/2004 | Watts et al. | 356/401 |
| 2004/0022888 A1 | 2/2004 | Sreenivasan et al. | 425/174.4 |
| 2004/0036201 A1 | 2/2004 | Chou et al. | 264/402 |
| 2004/0046288 A1 | 3/2004 | Chou | 264/479 |
| 2004/0081798 A1 | 4/2004 | Lee et al. | 428/141 |
| 2004/0124566 A1 | 7/2004 | Sreenivasan et al. | 264/494 |
| 2004/0149367 A1 | 8/2004 | Olsson et al. | 156/64 |
| 2004/0169003 A1 | 9/2004 | Lee et al. | 216/4 |
| 2004/0192041 A1 | 9/2004 | Jeong et al. | 438/689 |
| 2004/0200411 A1 | 10/2004 | Willson et al. | 118/500 |
| 2004/0209470 A1 | 10/2004 | Bajorek | 438/689 |
| 2004/0219249 A1 | 11/2004 | Chung et al. | 425/385 |
| 2004/0219461 A1 | 11/2004 | Chung et al. | 430/311 |
| 2005/0039618 A1 | 2/2005 | Heidari et al. | 101/368 |
| 2005/0064054 A1 | 3/2005 | Kasumi | 425/112 |
| 2005/0224452 A1 | 10/2005 | Spiess et al. | |
| 2005/0230882 A1 | 10/2005 | Watts et al. | |
| 2006/0137555 A1* | 6/2006 | Simon | 101/483 |
| 2006/0279025 A1* | 12/2006 | Heidari et al. | 264/496 |
| 2007/0051697 A1* | 3/2007 | DiPietro et al. | 216/52 |

FOREIGN PATENT DOCUMENTS

| | | |
|---|---|---|
| JP | 2005-527110 T | 9/2005 |
| JP | 2006-168147 A | 6/2006 |
| WO | WO 01/79591 A1 | 10/2001 |
| WO | WO 01/79592 A1 | 10/2001 |
| WO | 03/087935 A2 | 10/2003 |

OTHER PUBLICATIONS

English translation of Japanese Official Action issued on Sep. 8, 2010 in Japanese Application No. 2007-164950.

* cited by examiner

IMPRINT LITHOGRAPHY

BACKGROUND OF THE INVENTION

1. Field of the Invention

The present invention relates to imprint lithography.

2. Description of the Related Art

A lithographic apparatus is a machine that applies a desired pattern onto a target portion of a substrate. Lithographic apparatus are conventionally used, for example, in the manufacture of integrated circuits (ICs), flat panel displays and other devices involving fine structures.

It is desirable to reduce the size of features in a lithographic pattern because this allows for a greater density of features on a given substrate area. In photolithography, the increased resolution may be achieved by using light of shorter wavelength. However, there are problems associated with such reductions. Current systems are starting to adopt optical sources with wavelengths in the 193 nm regime but even at this level, diffraction limitations become a barrier. At lower wavelengths, the transparency of materials is very poor. Optical lithography machines capable of enhanced resolutions require complex optics and rare materials and are consequently very expensive.

An alternative for printing sub-100 nm features, known as imprint lithography, comprises transferring a pattern to a substrate by imprinting a pattern into an imprintable medium using a physical mould or template. The imprintable medium may be the substrate or a material coated on to a surface of the substrate. The imprintable medium may be functional or may be used as a "mask" to transfer a pattern to an underlying surface. The imprintable medium may for instance be provided as a resist deposited on a substrate such as a semiconductor material to which the pattern defined by the template is to be transferred. Imprint lithography is thus essentially a moulding process on a micrometer or nanometer scale in which the topography of a template defines the patterns created on a substrate. Patterns may be layered as with optical lithography processes so that in principle imprint lithography could be used for such applications as IC manufacture.

The resolution of imprint lithography is largely limited only by the resolution of the template fabrication process. For instance, imprint lithography has been used to produce features in the sub-50 nm range with significantly improved resolution and line edge roughness compared to that achievable with conventional optical lithography processes. In addition, imprint processes do not require expensive optics, advanced illumination sources or specialised resist materials typically required by optical lithography processes.

Imprint lithography templates are conventionally manufactured using e-beam lithography. This is an expensive and time consuming process.

SUMMARY OF THE INVENTION

According to a first embodiment of the present invention there is provided a method of making an imprint lithography template, the method comprising applying a curable material to a patterned surface of a master imprint template; curing the curable material and thereby forming a second imprint template having a patterned surface which is the inverse of the patterned surface of the master imprint template; removing the second imprint template from the master imprint template; applying inorganic sol-gel to a substrate; imprinting the inorganic sol-gel with the second imprint template; allowing the inorganic sol-gel to cure; and removing the second imprint template from the cured inorganic sol-gel, such that the inorganic sol-gel forms a third imprint template having a patterned surface which corresponds with the patterned surface of the master imprint template.

A method of making an imprint lithography template comprises applying a curable material to a patterned surface of a master imprint template; curing the curable material and thereby forming a second imprint template having a patterned surface which is the inverse of the patterned surface of the master imprint template; removing the second imprint template from the master imprint template; applying inorganic sol-gel to the patterned surface of the second imprint template; bringing a substrate into contact with the inorganic sol-gel; allowing the inorganic sol-gel to cure; and removing the second imprint template from the cured inorganic sol-gel, such that the inorganic sol-gel forms a third imprint template having a patterned surface which corresponds with the patterned surface of the master imprint template.

According to a third embodiment of the invention there is provided an imprint template comprising a substrate and cured inorganic sol-gel bearing a pattern.

Further features of the present invention will be apparent from the following description.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

There are two principal approaches to imprint lithography which will be termed generally as hot imprint lithography and UV imprint lithography. There is also a third type of imprint lithography which may be referred to as "printing" lithography. Examples of these are illustrated in FIGS. 1a to 1c.

Figure 1A:
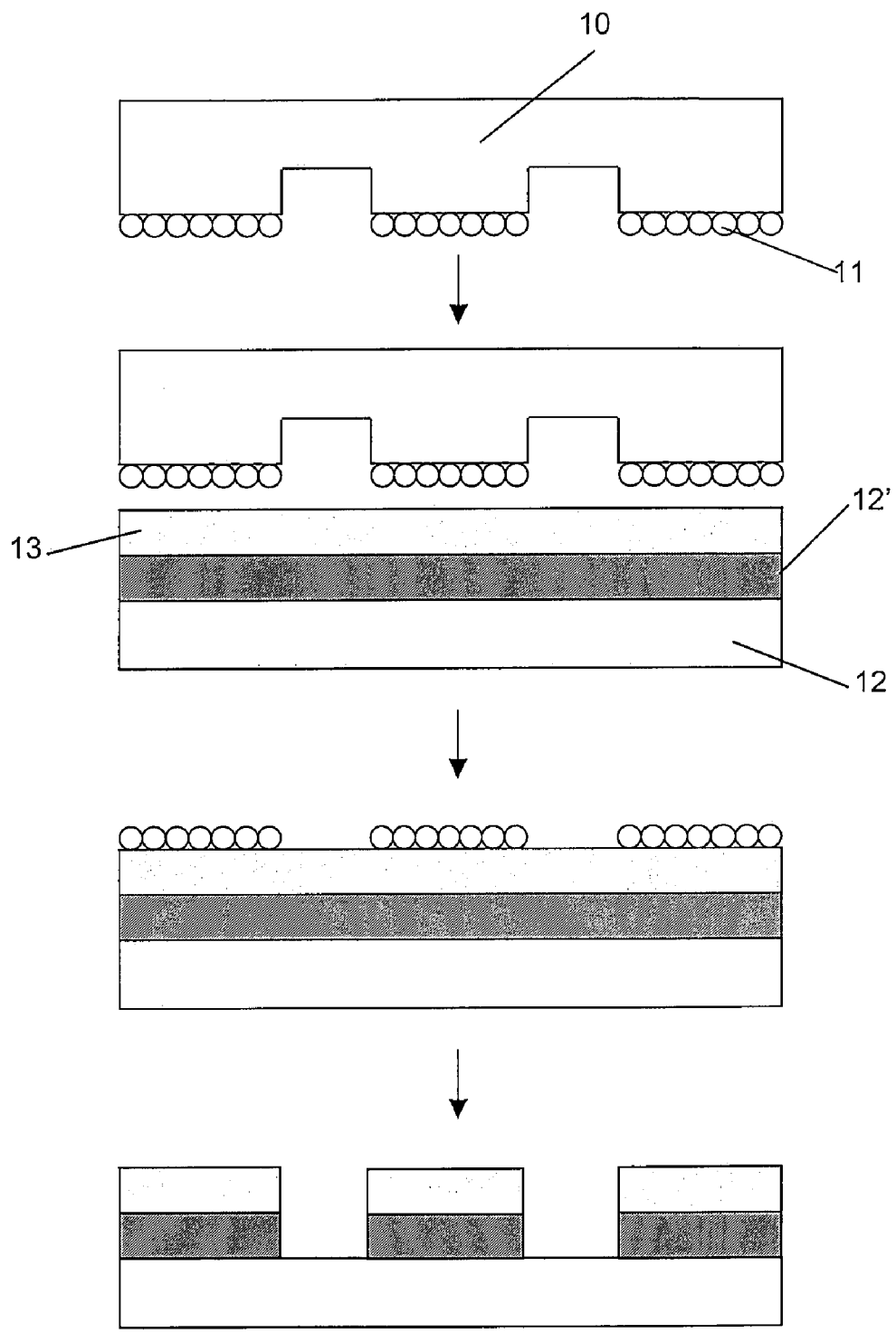
FIG. 1a-1c illustrate examples of conventional 'printing', hot and UV lithography processes respectively.
Figure 1B:
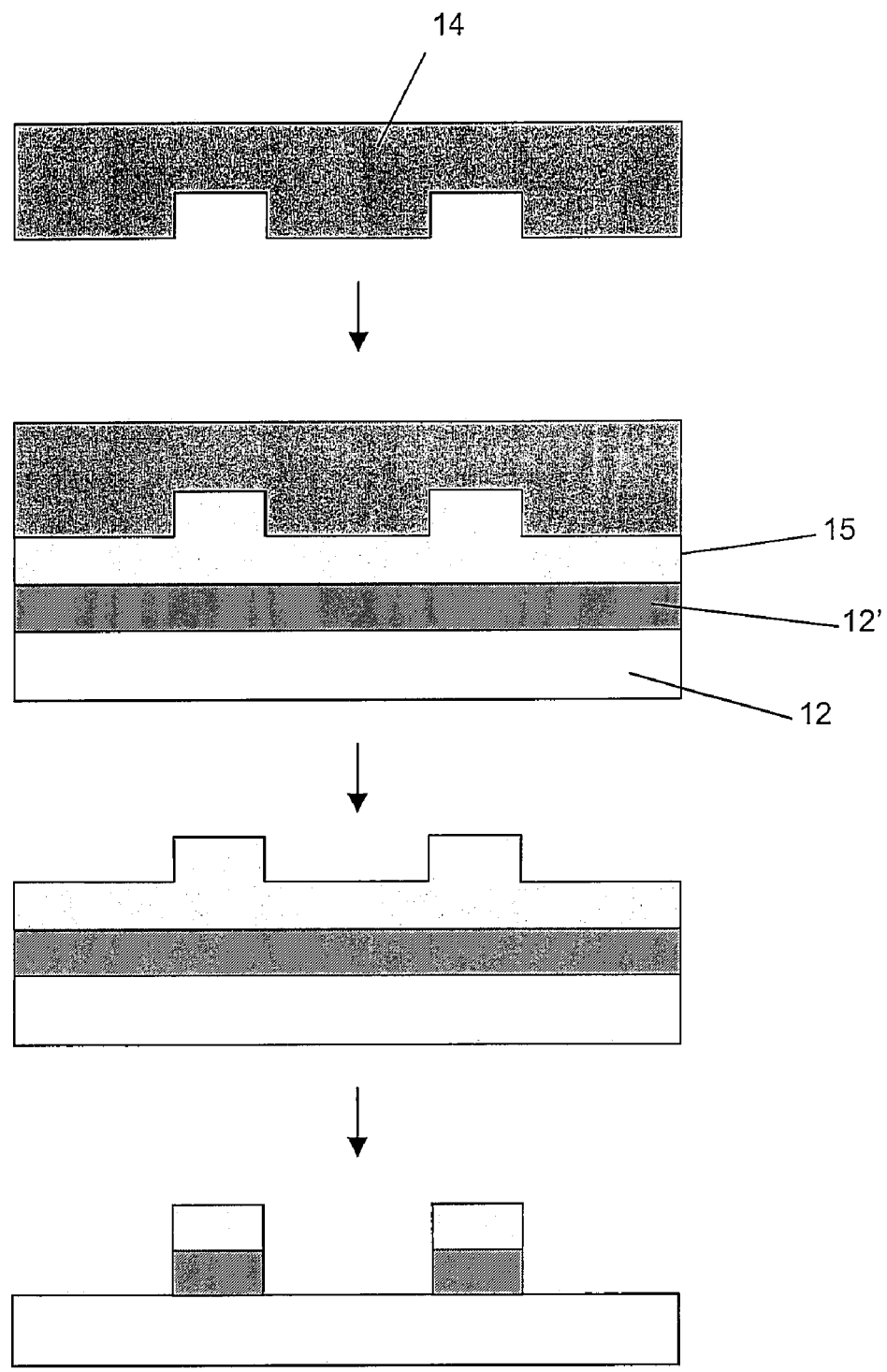
Figure 1C:
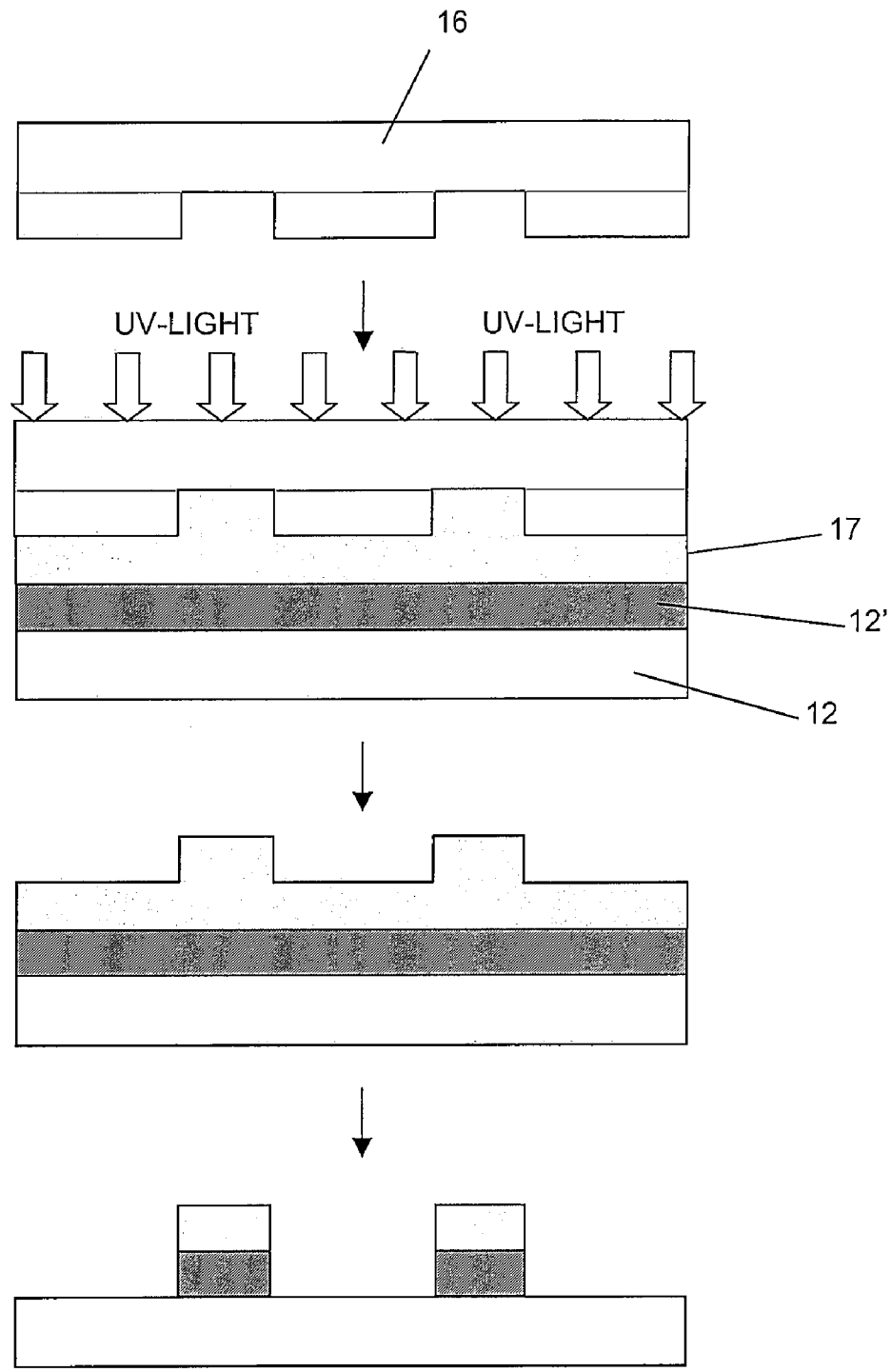

FIG. 1a shows a printing lithography process, known as micro-contact printing, which involves transferring a layer of molecules 11 (typically an ink such as a thiol) from a flexible template 10 (typically fabricated from polydimethylsiloxane (PDMS) onto a resist layer 13 which is supported upon a substrate 12 and planarisation and transfer layer 12'. The template 10 has a pattern of features on its surface, the molecular layer being disposed upon the features. When the template is pressed against the resist layer the layer of molecules 11 stick to the resist. Upon removal of the template from the resist the layer of molecules 11 stick to the resist, the residual layer of resist is etched such that the areas of the resist not covered by the transferred molecular layer are etched down to the substrate.

Printing lithography is an example of soft imprint lithography. The term 'soft imprint lithography' is generally used to mean imprint lithography in which the imprint template is elastically deformable.

When fabricating multiple layer structures, in which the same region will be overlaid multiple times, soft imprint lithography may not provide overlay accuracy on a nanometer scale.

Hot imprint lithography (or hot embossing) is also known as nanoimprint lithography (NIL) when used on a nanometer scale. The process uses harder templates made from, for example, silicon or nickel, which are more resistant to wear and deformation. This is described for instance in U.S. Pat. Nos. 4,731,155 and 5,772,905, and illustrated in FIG. 1b. In a typical hot imprint process a solid template 14 is imprinted into a thermosetting or a thermoplastic polymer resin 15, which has been cast on the surface of a substrate 12. The resin may for instance be spin coated and baked onto the substrate surface or more typically (as in the example illustrated) onto a planarisation and transfer layer 12'. It shall be understood that the term "hard" when describing an imprint template includes materials which may generally be considered between "hard" and "soft" materials, such as for example "hard" rubber. The suitability of a particular material for use as an imprint template is determined by its application requirements.

When a thermosetting polymer resin is used the resin is heated to a temperature such that, upon contact with the template, the resin is sufficiently flowable to flow into the pattern features defined on the template. The temperature of the resin is then increased to thermally cure (e.g. crosslink) the resin so that it solidifies and irreversibly adopts the desired pattern. The template may then be removed and the patterned resin cooled.

Examples of thermoplastic polymer resins used in hot imprint lithography processes are poly (methyl methacrylate), polystyrene, poly (benzyl methacrylate) or poly (cyclohexyl methacrylate). The thermoplastic resin is heated so that it is in a freely flowable state immediately prior to imprinting with the template. It is typically necessary to heat thermoplastic resins to temperatures considerably above the glass transition temperature of the resin. The template is pressed into the flowable resin and sufficient pressure is applied to ensure the resin flows into all the pattern features defined on the template. The resin is then cooled to below its glass transition temperature with the template in place whereupon the resin irreversibly adopts the desired pattern. The pattern will consist of the features in relief from a residual layer of the resin which may then be removed by an appropriate etch process to leave only the pattern features.

Figure 2:
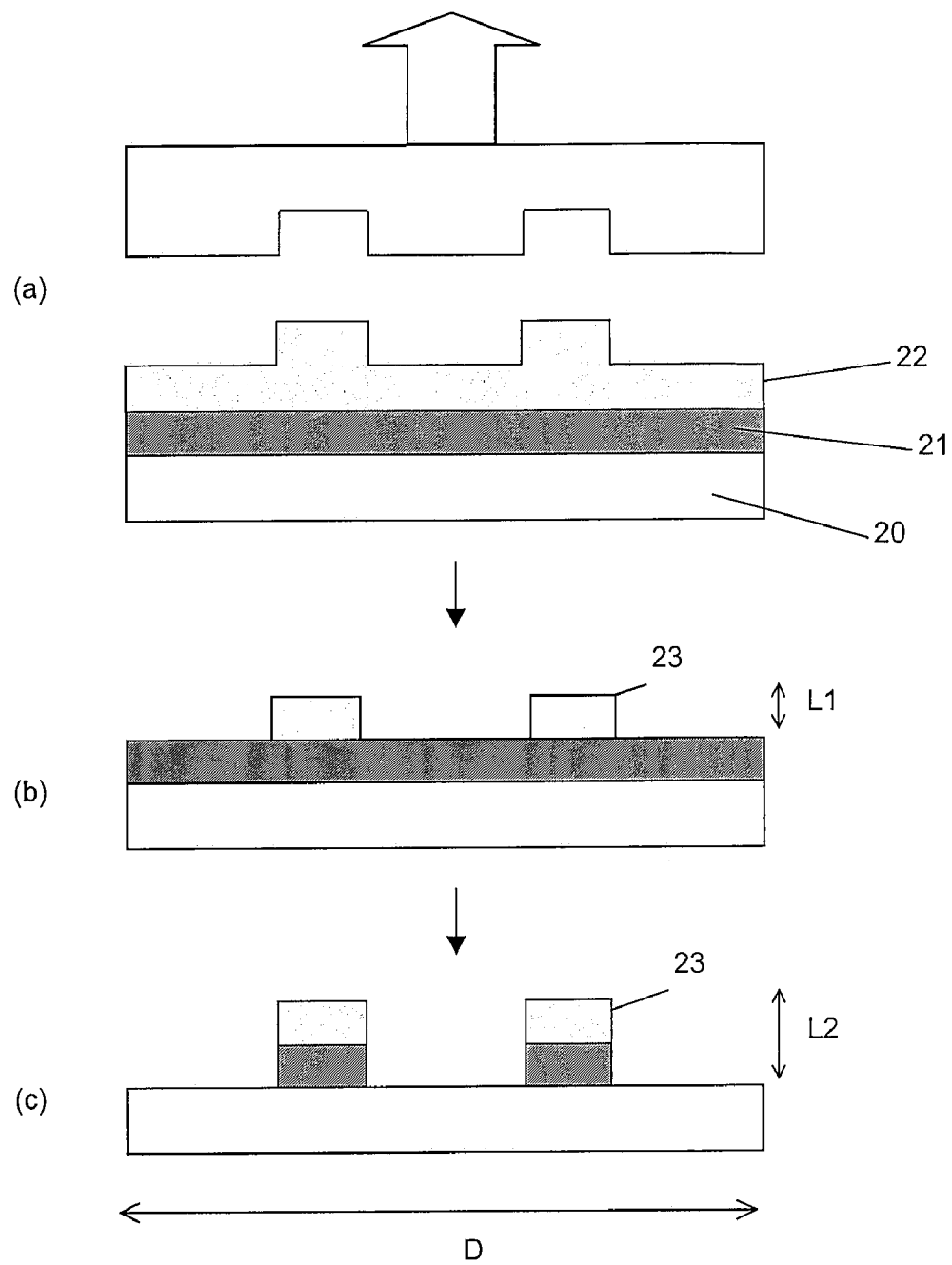
FIG. 2 illustrates a two step etching process employed when hot and UV imprint lithography is used to pattern a resist layer.

Upon removal of the template from the solidified resin, a two-step etching process is performed as illustrated in FIGS. 2a to 2c. The substrate 20 has a planarisation and transfer layer 21 immediately upon it, as shown in FIG. 2a. The purpose of the planarisation and transfer layer is twofold. It acts to provide a surface parallel to that of the template, which is important to ensure that the contact between the template and the resin is parallel, and also to improve the aspect ratio of the printed features, as will be described below.

After the template has been removed, a residual layer 22 of the solidified resin is left on the planarisation and transfer layer, shaped in the desired pattern. The first etch removes parts of the residual layer. The first etch is preferably anisotropic. In some instances the first etch may be isotropic, resulting in a poor aspect ratio of features where L1 is the height of the features 23, as shown in FIG. 2b. The second etch, which is anisotropic (or selective), improves the aspect ratio. The anisotropic etch removes those parts of the planarisation and transfer layer which are not covered by the solidified resin, increasing the aspect ratio of the features 23 to (L2/D), as shown in FIG. 2c. The resulting polymer thickness contrast left on the substrate after etching can be used as for instance a mask for dry etching if the imprinted polymer is sufficiently resistant, for instance as a step in a lift-off process.

Hot imprint lithography suffers from a disadvantage in that not only is the pattern transfer be performed at a higher temperature, but also relatively large temperature differentials might be required in order to ensure the resin is adequately solidified before the template is removed. Temperature differentials between 35 and 100° C. are known from literature. Differential thermal expansion between for instance the substrate and template can then lead to distortion in the transferred pattern. The problem is exacerbated by the relatively high pressures used for the imprinting step, due the viscous nature of the imprintable materials, which can induce mechanical deformation in the substrate, again distorting the pattern.

UV imprint lithography on the other hand does not involve such high temperatures and temperature changes. Nor does it require such viscous imprintable materials. Rather UV imprint lithography involves the use of a transparent template and a UV-curable liquid, typically a monomer such as an acrylate or methacrylate for example. In general any photopolymerisable material could be used, such as a mixture of monomers and an initiator. The curable liquid may also for instance include a dimethyl siloxane derivative. Such materials are much less viscous than the thermosetting and thermoplastic resins used in hot imprint lithography and consequently move much faster to fill template pattern features. Low temperature and low pressure operation also favours higher throughput capabilities. Although the name 'UV imprint lithography' implies that UV light is always used, it should be appreciated that any suitable actinic radiation may be used (for example visible light may be used). Hence, any reference in this document to UV imprint lithography, UV light, or UV curable materials, etc should be interpreted as including any suitable actinic radiation, and should not be interpreted as being limited to UV light only.

An example of a UV imprint process is illustrated in FIG. 1c. A quartz template 16 is applied to a UV-curable resin 17 in a similar manner to the process of FIG. 1b. Instead of raising the temperature as in hot embossing employing thermosetting resins, or temperature cycling when using thermoplastic resins, UV light is applied to the resin through the quartz template in order to polymerise and thus cure it. Upon removal of the template, the remaining steps of etching the residual layer of resist are the same as for the hot embossing process described above. The UV curable resins typically used have a much lower viscosity than typical thermoplastic resins so that lower imprint pressures are used. Reduced physical deformation due to the lower pressures, together with reduced deformation due to high temperatures and temperature changes, makes UV imprint lithography better suited to application requiring high overlay accuracy. In addition the transparent nature of UV imprint templates can accommodate optical alignment techniques simultaneously to the imprint.

Although this type of imprint lithography mainly uses UV curable materials, and is thus generically referred to as UV imprint lithography, other wavelengths of light may be used to cure appropriately selected materials (e.g. activate a polymerisation or cross linking reaction). In general any radiation capable of initiating such a chemical reaction may be used if an appropriate imprintable material is available. Alternative "activating light" may for instance include visible light, infrared light, x-ray radiation and electron beam radiation. In the general description above, and below, references to UV imprint lithography and use of UV light are not intended to exclude these and other activating light possibilities.

As an alternative to imprint systems using a planar template which is maintained substantially parallel to the substrate surface, roller imprint systems have been developed.

Both hot and UV roller imprint systems have been proposed in which the template is formed on a roller but otherwise the imprint process is very similar to imprinting using a planar template. Unless the context requires otherwise, references to an imprint template include references to roller templates.

There is a particular development of UV imprint technology known as step and flash imprint lithography (SFIL) which may be used to pattern a substrate in small steps in a similar manner to optical steppers conventionally used in IC manufacture. This involves printing small areas of the substrate at a time by imprinting a template into a UV curable resin, 'flashing' UV light through the template to cure the resin beneath the template, removing the template, stepping to an adjacent region of the substrate and repeating the operation. The small field size of such step and repeat processes minimises pattern distortions CD variations so that SFIL is particularly suited to manufacture of IC and other devices requiring high overlay accuracy.

Although in principle the UV curable resin can be applied to the entire substrate surface, for instance by spin coating, this is often problematic due to the volatile nature of UV curable resins.

One approach to addressing this problem is the so-called 'drop on demand' process in which the resin is dispensed onto a target portion of the substrate in droplets immediately prior to imprinting with the template. The liquid dispensing is controlled so that a certain volume of liquid is deposited on a particular target portion of the substrate. The liquid may be dispensed in a variety of patterns and the combination of carefully controlling liquid volume and placement of the pattern can be employed to confine patterning to the target area.

Dispensing the resin on demand as mentioned is not a trivial matter. The size and spacing of the droplets are carefully controlled to ensure there is sufficient resin to fill template features whilst at the same time minimizing excess resin which can be rolled to an undesirably thick or uneven residual layer since as soon as neighbouring drops touch fluid the resin will have nowhere to flow. The problems associated with overly thick or uneven residual layer are discussed below.

Figure 3:
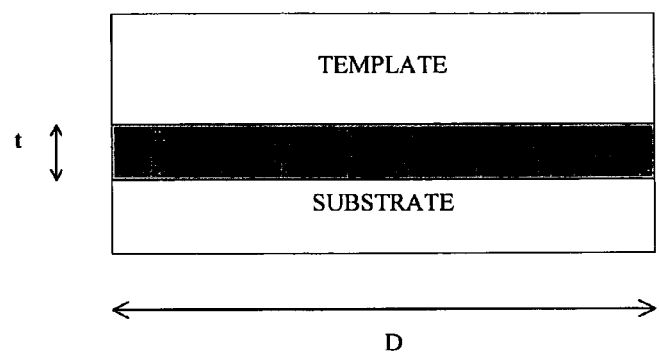
FIG. 3 illustrates a template and an imprintable resist layer deposited on a substrate.

FIG. 3 illustrates the relative dimensions of the template, imprintable material (curable monomer, thermosetting resin, thermoplastic etc) and substrate. In an embodiment, the ratio of the width of the substrate, D, to the thickness of the curable resin layer, t, is of the order of $10^6$. It will be appreciated that, in order to avoid the features projecting from the template damaging the substrate, the dimension t should be greater than the depth of the projecting features on the template.

The residual layer left after stamping is useful in protecting the underlying substrate, but as mentioned above it is also the source of a number of problems particularly when high resolution and/or overlay accuracy is desired. The first 'breakthrough' etch may be anisotropic or isotropic. If the first etch is isotropic this will to some extent erode the features imprinted as well as the residual layer. This is exacerbated if the residual layer is overly thick and/or uneven.

This problem can for instance lead to variation in the thickness of lines ultimately formed in the underlying substrate (i.e. variation in the critical dimension). The uniformity of the thickness of a line that is etched in the transfer layer in the second anisotropic etch is dependant upon the aspect ratio and integrity of the shape of the feature left in the resin. If the residual resin layer is uneven, then the non-selective first etch can leave some of these features with "rounded" tops so that they are not sufficiently well defined to ensure good uniformity of line thickness in the second and any subsequent etch process.

In principle the above problem can be reduced by ensuring the residual layer is as thin as possible but this can require application of undesirably large pressures (increasing substrate deformation) and relatively long imprinting times (reducing throughput).

The template is a significant component of the imprint lithography system. As noted above, the resolution of the features on the template surface is a limiting factor on the attainable resolution of features printed on the substrate. The templates used for hot and UV lithography are generally formed in a two-stage process. Initially, the desired pattern is written using, for example, electron beam writing, to give a high resolution pattern in resist. The resist pattern is then transferred into a thin layer of chrome which forms the mask for the final, anisotropic etch step to transfer the pattern into the base material of the template. Other techniques such as for example ion-beam lithography, X-ray lithography, extreme UV lithography, epitaxial growth, thin film deposition, chemical etching, plasma etching, ion etching or ion milling could be used. Generally a technique capable of very high resolution will be preferred as the template is effectively a 1× mask with the resolution of the transferred pattern being limited by the resolution of the pattern on the template.

The release characteristics of the template may also be an important consideration. The template may for instance be treated with a surface treatment material to form a thin release layer on the template having a low surface energy (a thin release layer may also be deposited on the substrate).

Although reference is made above to depositing UV curable liquids onto a substrate, the liquids could also be deposited on the template and in general the same techniques and considerations will apply.

Another important consideration in the development of imprint lithography is the mechanical durability of the template. The template is subjected to large forces during stamping of the resist, and in the case of hot lithography, it is also subjected to extremes of pressure and temperature. This will cause wearing of the template, and may adversely affect the shape of the pattern imprinted upon the substrate.

In hot imprint lithography there are potential advantages in using a template of the same or similar material to the substrate to be patterned in order to minimise differential thermal expansion between the two. In UV imprint lithography the template is at least partially transparent to the activation light and accordingly quartz templates are used. Although specific reference may be made in this text to the use of imprint lithography in the manufacture of ICs, it should be understood that imprint apparatus and methods described may have other applications, such as the manufacture of integrated optical systems, guidance and detection patterns for magnetic domain memories, hard disc magnetic media, flat panel displays, thin-film magnetic heads, etc.

Whilst in the description above particular reference has been made to the use of imprint lithography to transfer a template pattern to a substrate via an imprintable resin effectively acting as a resist, in some circumstances the imprintable material may itself be a functional material, for instance having a functionally such as conductivity, optical linear or non linear response amongst others. For example the functional material may form a conductive layer, a semiconductive layer, a dielectric layer or a layer having another desirable mechanical, electrical or optical property. Some organic substances may also be appropriate functional materials. Such applications may be within the scope of an embodiment of the present invention.

Figure 4:
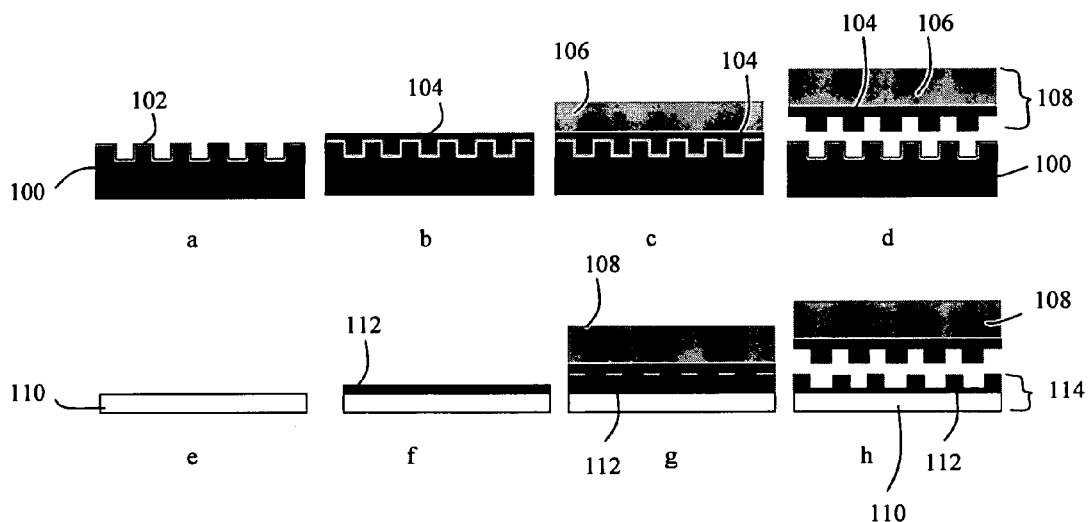
FIGS. 4 and 5 illustrate methods of making an imprint lithography template.

FIG. 4 shows schematically a method of making an imprint lithography template according to an embodiment of the invention. Referring to FIG. 4a, conventional e-beam lithography is used to make a master imprint template 100 in a conventional manner (described further above). The master imprint template 100 may be made of Si or $SiO_2$ (e.g. quartz). A release layer 102 is provided on a patterned upper surface of the master imprint template 100. The release layer 102 may be a monolayer of a fluorinated compound, for example fluorinated silane.

Referring to FIG. 4b, a layer of curable material 104, e.g. polydimethylsiloxane (PDMS), is applied onto the patterned upper surface of the master imprint template 100. In an embodiment, the curable material 104 is a liquid, and the layer is sufficiently thick that recesses of the pattern on the master imprint template 100 are filled and the PDMS forms a continuous surface over the imprint template. The curable material 104 is then cured, for example by placing it in an oven at a predetermined temperature. Curing of curable materials, e.g. curable PDMS, is not explained in detail here as it is well understood to those skilled in the art.

Referring to FIG. 4c, a carrier substrate 106 is provided with an adhesive monolayer (not shown) on its lowermost surface, and is then brought into contact with the cured PDMS 104. The carrier substrate 106 may for example be made from quartz. The adhesive monolayer secures the cured PDMS 104 to the carrier substrate 106. It is not necessary that the PDMS 104 be cured when the carrier substrate 106 is brought into contact with it. The substrate may be brought into contact with the PDMS before it is cured, and held in position until curing has taken place.

Referring to FIG. 4d, the carrier substrate 106 and cured PDMS 104 are removed from the master imprint template 100. The lowermost surface of the cured PDMS has a pattern which is the inverse of the pattern in the master imprint template 100. For ease of reference, the cured PDMS 104 and the carrier substrate 106 are referred to as the second imprint template 108 (the master imprint template 100 is considered to be the first imprint template).

Referring to FIG. 4e, a substrate 110, e.g. a quartz substrate, which will form part of an imprint template is provided. The (quartz) substrate 110 may be provided on its upper surface with a layer of chromium (not shown) or other material to form a transfer layer. It is not essential that a transfer layer is provided.

As shown in FIG. 4f, a layer of sol-gel 112 is spin-coated onto the quartz substrate 110. The layer of sol-gel 112 may be spin-coated onto the substrate 110 with good thickness uniformity, for example to within around 0.1 nanometers over an area of several square centimeters. In an embodiment, the sol-gel is inorganic. An example of a sol-gel which could be used is the sol-gel known as spin-on-glass silica. The solvent included in this sol-gel is ethanol. The sol-gel is liquid when it is spin coated onto the substrate, and then becomes a gel as solvent evaporates out of it (i.e. the sol-gel begins to cure). Other suitable sol-gels include, but are not limited to, (with an appropriate solvent) titanium oxide, hafnium oxide, zirconium oxide, tin oxide, zinc oxide, and germanium oxide.

Referring to FIG. 4g, the second imprint template 108 is imprinted into the sol-gel 112. The sol-gel 112 continues to cure. This happens in part because the solvent in the sol-gel 112 diffuses into the PDMS 104 of the second imprint template 108. As the solvent leaves the sol-gel 112 increasing numbers of condensation reactions and cross linking occur within the sol-gel, and it thereby becomes more and more solid. Water from the sol-gel 112 may also diffuse into the PDMS 104 (water is formed during condensation of sol-gel). Sufficient time is allowed to elapse for the sol-gel 112 to become solid (i.e. for the sol-gel to cross-linked to a sufficient degree that it will retain its shape).

Referring to FIG. 4h, the second imprint template 108 is removed, leaving behind a substrate 110 supporting a patterned layer of cured sol-gel 112, the pattern being the same as the pattern on the master imprint template 100. Thus, an imprint template 114 formed from cured sol-gel 112 on a quartz substrate 110, which matches a master imprint template 100, has been cheaply and conveniently fabricated. The imprint template 114, which for ease of reference is referred to as the third imprint template, is sufficiently mechanically stable to allow it to be used in the same manner as a conventionally made imprint template.

In order to make the imprint template 114 more durable, it may be fired by placing it in an oven at for example between 200° C. and 1000° C. Firing the imprint template in this way makes the cured sol-gel 112 less porous, thereby increasing its durability.

The cured sol-gel has substantially the same surface chemistry as fused silica, and the cured sol-gel 112 of the third imprint template 114 is therefore well matched to the quartz substrate 110 on which it is provided. For example, the thermal expansion coefficient of the cured sol-gel 112 is the same or very close to that of the quartz substrate 110, with the result that any change in temperature will cause substantially the same amount of thermal expansion or contraction to take place in both the cured sol-gel and the quartz substrate. This is advantageous because it avoids stress and/or distortion of the imprint template pattern occurring due to temperature changes.

Sol-gel is transparent to UV radiation, and has good resistance to UV radiation, thereby making it useful for UV imprint lithography.

Although the embodiment of the invention uses PDMS to form the inverse imprint template 108, other suitable materials may be used. In an embodiment, the material ise elastically deformable. The term 'elastically deformable' is intended to mean sufficiently deformable to aid release of the inverse imprint template 108 from the master imprint template 100. Preferably, the material should not react with inorganic sol-gel, and should be permeable to sol-gel solvent.

It has been mentioned, for example in U.S. Patent Application Publication 2005/0230882A1, to use organic materials to form imprint templates. The use of inorganic sol-gel has several advantages over organic material. In particular, organic material may suffer from creep, i.e. progressive shrinkage due to inherent tension within the material, leading to distortion of the pattern formed in the organic material. Cured inorganic sol-gel has substantial resistance to creep. Organic materials have a very different thermal expansion coefficient to fused silica or quartz, and this may lead to stresses and distortions at the interface between the quartz and the organic material in response to temperature changes. As mentioned above, cured inorganic sol-gel has a thermal expansion coefficient which is the same or virtually the same as fused silica or quartz. Temperature changes will therefore not lead to substantial distortions. Organic materials may suffer from degradation as a result of long term UV exposure. As mentioned above, cured inorganic sol-gel does not degrade when exposed to UV radiation. Organic materials may delaminate from a quartz or fused silica substrate. Cured inorganic sol-gel, however, adheres well because it has similar materials characteristics to quartz or fused silica. Organic materials are often soft and are not scratch resistant, resulting in increased susceptibility to damage. Cured inorganic sol-gel is generally more durable. Also, often it is difficult to clean an imprint template formed from organic material, since it is generally difficult to remove organic resist from the organic imprint template without also removing part of the organic imprint template.

Figure 5:
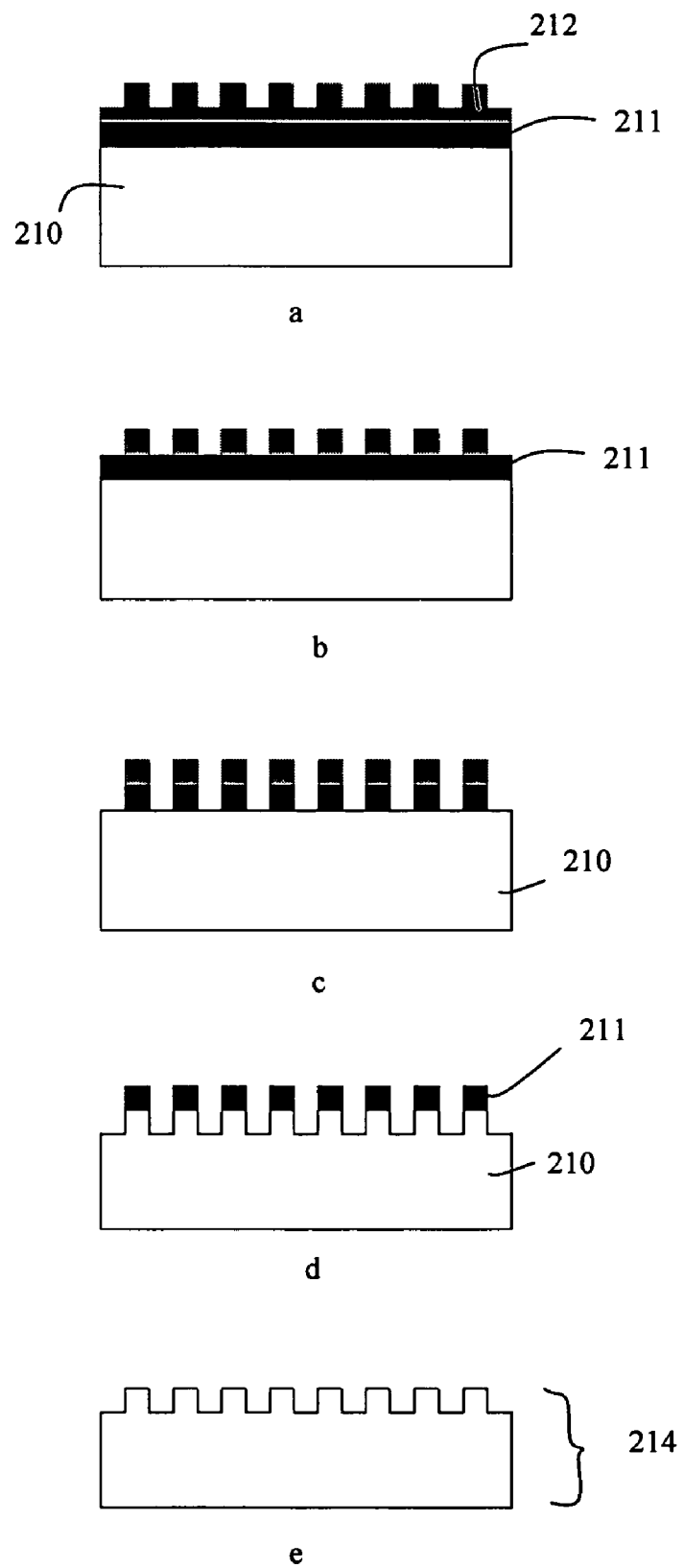

FIG. 5 shows an alternative embodiment of the invention. Referring to FIG. 5, a quartz substrate 210 supports a patterned layer of cured sol-gel 212. A chromium layer 211 (or other transfer layer) is provided between the substrate 210 and the cured sol-gel 212. The structure shown in FIG. 5a may be formed using the method described above in relation to FIG. 4.

Instead of using the structure shown in FIG. 5a as an imprint template, etching is used to transfer the pattern of the cured sol-gel 212 into the quartz substrate 210. The quartz substrate may then be used as an imprint template.

Referring to FIG. 5b, a reactive ion etch (for example using a fluorine plasma) is used to etch through the residual sol-gel layer. This is a breakthrough etch, i.e. it breaks through the sol-gel 212 and exposes the chromium 211 in recesses of the pattern.

Referring to FIG. 5c, a second reactive ion etch (for example using a chlorine or oxygen plasma) is used to etch through the chromium layer 211. This is known as a transfer etch, and exposes the quartz 210 in recesses of the pattern.

Referring to FIG. 5d, a reactive ion etch (for example using fluorine plasma) is used to etch into the quartz 210. Following this, as shown in FIG. 5e, the chromium 211 is stripped away, for example using a wet-chemical chrome etch, to yield a quartz imprint template 214. The pattern provided on the quartz imprint template 214 corresponds with the pattern formed in the sol-gel layer 212. The method illustrated in FIG. 5 allows a quartz imprint template to be constructed in a low cost and convenient manner.

The above description of embodiments of the invention refers to quartz substrates. It will be appreciated that fused silica may be used instead of quartz. Substrates may also be formed from any other suitable material, for example silicon.

The invention allows many replicas to be made of a master imprint template, by imprinting sol-gel in the manner described above in relation to FIG. 4 and/or FIG. 5 a plurality of times. This reduces the cost of imprint lithography, especially in cases where a given pattern is to be used many times. For example, it may be desired to simultaneously imprint the same pattern onto a substrate in multiple, e.g. 5, different locations. The invention allows the necessary multiple imprint templates to be cheaply and conveniently made. It may be desired to provide imprint templates in multiple imprint lithography machines, all of the imprint templates having the same pattern. The invention allows the multiple imprint templates to be cheaply and conveniently made.

Although the embodiments of the invention refer to providing sol-gel onto a substrate which is imprinted by cured PDMS, it will be appreciated that the invention may be implemented in other ways. For example, the sol-gel may be applied directly onto the cured PDMS (or equivalent material), a substrate subsequently being fixed to the sol-gel. The sol-gel, once cured, may then be lifted from the PDMS.

While specific examples of the invention have been described above, it will be appreciated that the present invention may be practiced otherwise than as described. The description is not intended to limit the invention.

What is claimed is:

1. A method of making an imprint lithography template, the method comprising:
    applying a curable material to a patterned surface of a master imprint template;
    curing the curable material and thereby forming a second imprint template having a patterned surface which is the inverse of the patterned surface of the master imprint template;
    removing the second imprint template from the master imprint template;
    applying inorganic sol-gel to a substrate;
    imprinting the inorganic sol-gel with the second imprint template;
    allowing the inorganic sol-gel to cure; and
    removing the second imprint template from the cured inorganic sol-gel, such that the inorganic sol-gel forms a third imprint template having a patterned surface which corresponds with the patterned surface of the master imprint template.

2. The method of claim 1, wherein the inorganic sol-gel comprises a solvent and a material selected from the group of silicon oxide, titanium oxide, hafnium oxide, zirconium oxide, tin oxide, zinc oxide, and germanium oxide.

3. The method of claim 1, wherein the third imprint template is subsequently cured by firing it in an oven.

4. The method of claim 1, wherein the substrate is formed from quartz, fused silica, or silicon.

5. The method of claim 1, wherein the substrate to which the sol-gel is applied is provided with a transfer layer.

6. The method of claim 5, wherein reactive ion etching is used to selectively etch the sol-gel and transfer layer, thereby transferring the pattern of the inorganic sol-gel into the substrate.

7. The method of claim 6, wherein following the etching, the transfer layer is removed from the substrate.

8. The method of claim 1, wherein the curable material comprises polydimethylsiloxane (PDMS).

9. The method of claim 1, wherein the curable material is secured to a carrier substrate after it has been allowed to cure.

10. The method of claim 1, wherein a carrier substrate is brought into contact with the curable material before it has been allowed to cure.

11. The method of claim 1, wherein the patterned surface of the master imprint template is provided with a release layer.

12. The method of claim 1, wherein the second imprint template is used to imprint sol-gel a plurality of times, thereby allowing a plurality of imprint templates to be made, each imprint template having a patterned surface which corresponds with the patterned surface of the master imprint template.

13. A method of making an imprint lithography template, the method comprising:
    applying a curable material to a patterned surface of a master imprint template;
    curing the curable material and thereby forming a second imprint template having a patterned surface which is the inverse of the patterned surface of the master imprint template;
    removing the second imprint template from the master imprint template;
    applying inorganic sol-gel to the patterned surface of the second imprint template;
    bringing a substrate into contact with the inorganic sol-gel;
    allowing the inorganic sol-gel to cure; and
    removing the second imprint template from the cured inorganic sol-gel, such that the inorganic sol-gel forms a third imprint template having a patterned surface which corresponds with the patterned surface of the master imprint template.

14. The method of claim 13, wherein the inorganic sol-gel comprises a solvent and a material selected from the group of silicon oxide, titanium oxide, hafnium oxide, zirconium oxide, tin oxide, zinc oxide, and germanium oxide.

15. The method of claim 13, wherein the curable material comprises polydimethylsiloxane (PDMS).

16. The method of claim 13, wherein the substrate to which the sol-gel is applied is provided with a transfer layer.

17. The method of claim 16, wherein reactive ion etching is used to selectively etch the sol-gel and transfer layer, thereby transferring the pattern of the inorganic sol-gel into the substrate.

18. The method of claim 17, wherein following the etching, the transfer layer is removed from the substrate.

19. The method of claim 13, wherein the second imprint template is used to imprint sol-gel a plurality of times, thereby allowing a plurality of imprint templates to be made, each imprint template having a patterned surface which corresponds with the patterned surface of the master imprint template.

* * * * *